United States Patent [19]

Norris, Jr. et al.

[11] 4,328,466
[45] May 4, 1982

[54] ELECTRON BOMBARDED SEMICONDUCTOR DEVICE WITH DOUBLY-DISTRIBUTED DEFLECTION MEANS

[75] Inventors: Carroll B. Norris, Jr., Albuquerque, N. Mex.; Aris Silzars, Redwood City; David J. Bates, Los Altos, both of Calif.

[73] Assignee: Watkins-Johnson Company, Palo Alto, Calif.

[21] Appl. No.: 269,504

[22] Filed: Jul. 3, 1972

[51] Int. Cl.³ .............................................. H03F 3/08
[52] U.S. Cl. ..................................... 330/308; 330/46; 315/3
[58] Field of Search .......... 315/3; 313/65 AB, 83 SP; 330/4.9, 308, 44, 46

[56] References Cited

U.S. PATENT DOCUMENTS

| | | | |
|---|---|---|---|
| 3,050,657 | 8/1962 | Branch, Jr. | 315/3 X |
| 3,234,476 | 2/1966 | Sackinger | 330/46 X |
| 3,376,464 | 4/1968 | Loti et al. | 315/3 |
| 3,433,994 | 3/1969 | Gibson, Jr. | 313/65 AB |
| 3,504,222 | 3/1970 | Fukushima | 315/3 |
| 3,694,689 | 9/1972 | Odenthal et al. | 315/3 |
| 3,696,266 | 10/1972 | Nishino et al. | 315/3 |
| 3,749,961 | 7/1973 | Bates et al. | 315/3 |
| 3,818,363 | 6/1974 | Carter et al. | 330/44 X |
| 3,922,616 | 11/1975 | Weiner | 330/46 X |
| 4,045,705 | 8/1977 | Smith et al. | 330/43 X |

OTHER PUBLICATIONS

Taylor, *Electron Beam Semiconductor Amplifier*, 1970 Conf. on Electron Device Techniques.

*Primary Examiner*—Peter A. Nelson
*Attorney, Agent, or Firm*—Flehr, Hohbach, Test, Albritton & Herbert

[57] ABSTRACT

An electron bombarded semiconductor amplifier including an elongated envelope having an electron gun projecting a sheet electron beam towards a distributed element semiconductor target which propagates an output signal including a single extended area semiconductor diode or a plurality of series-connected semiconductor diodes which are reverse biased and a doubly-distributed deflection means adapted to receive an input signal and cooperate with said sheet electron beam to deflect the beam in accordance with an input signal in synchronism with electron beam velocity and target signal propagation velocity to strike the target and generate an amplifier output signal.

26 Claims, 21 Drawing Figures

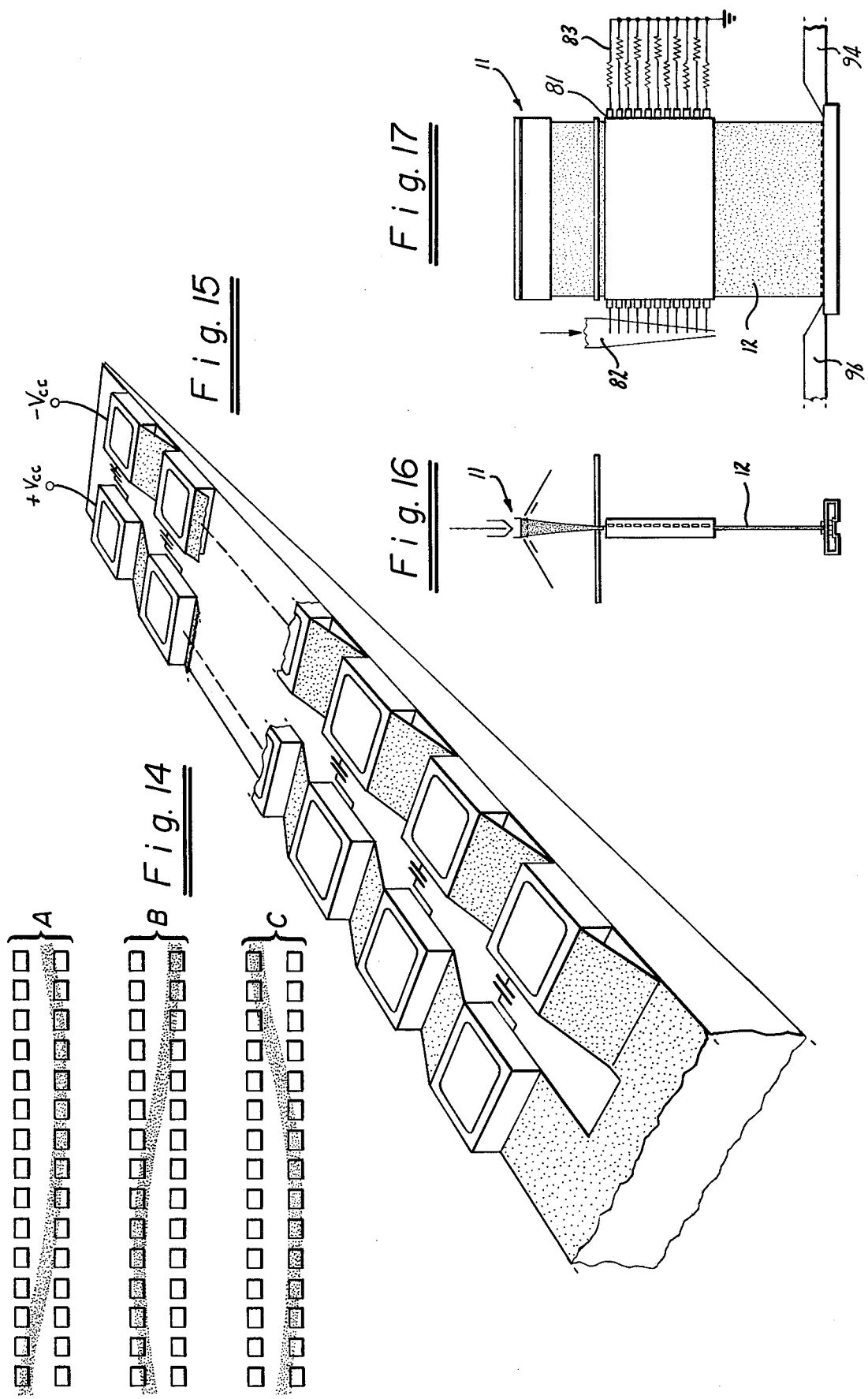

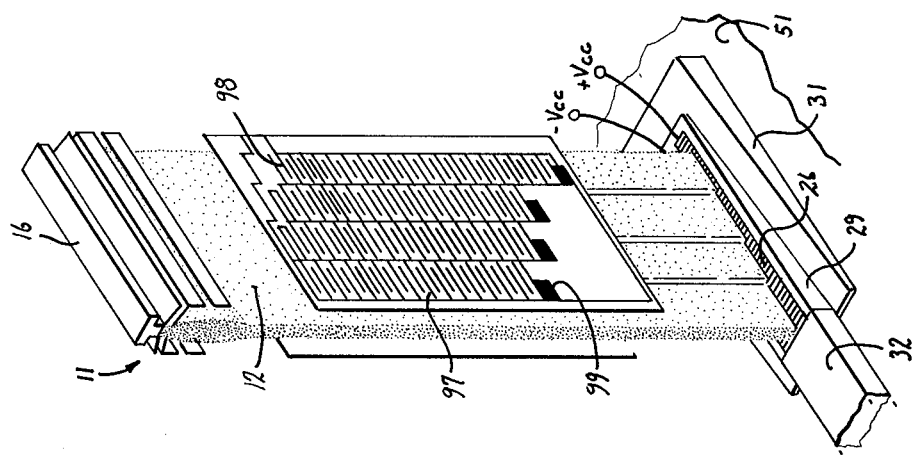
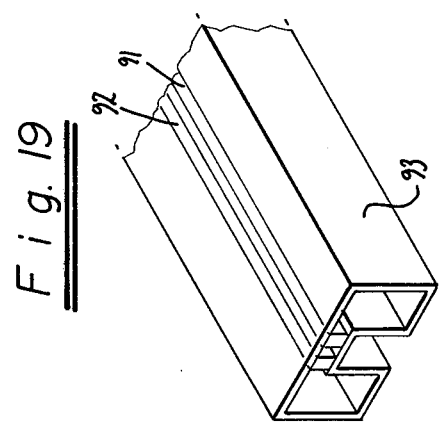
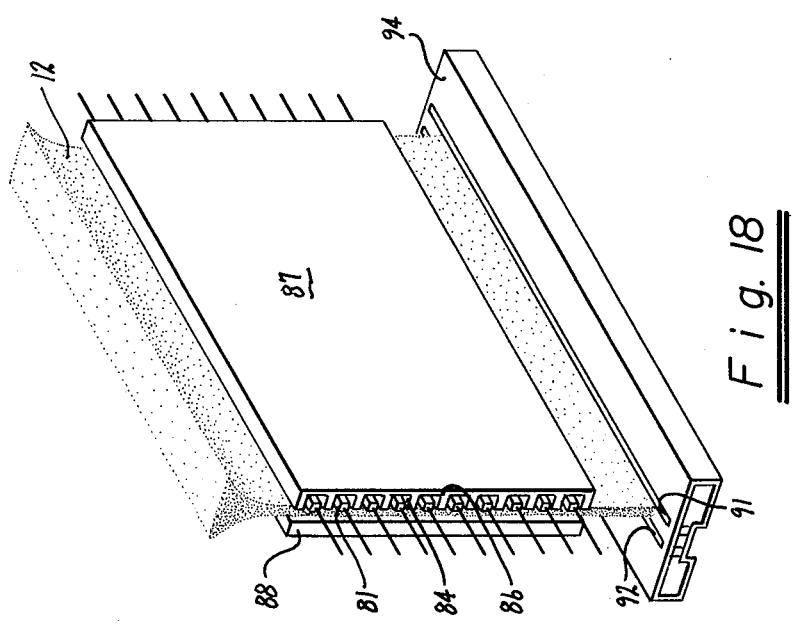
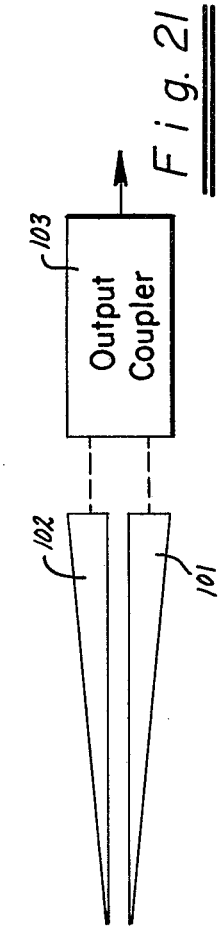

1

ELECTRON BOMBARDED SEMICONDUCTOR DEVICE WITH DOUBLY-DISTRIBUTED DEFLECTION MEANS

BACKGROUND OF THE INVENTION

This invention relates to amplifiers and more particularly to an electron bombarded semiconductor amplifier having distributed RF circuit elements.

Electron devices with semiconductor targets are known. However, such devices have been relatively low power, low frequency devices. The deflection means for the beam were primarily suitable for low frequency input signals. In co-pending application Ser. No. 204,810, filed Dec. 6, 1971 now U.S. Pat. No. 3,749,961, there is described an electron bombarded semiconductor amplifier including an improved laminar flow electron gun and improved meander line for receiving a signal to be amplified and deflect the electron beam so that it strikes one or more reversed biased semiconductor diodes which provide amplified output signals. The amplifier described in said co-pending application is a relatively high frequency lumped RF element broadband amplifier.

OBJECTS AND SUMMARY OF THE INVENTION

It is a general objective of the present invention to provide an electron bombarded semiconductor amplifier for wideband high frequency high power operation.

It is another object of the present invention to provide electron bombarded semiconductor amplifier including an improved distributed semiconductor target.

It is another object of the present invention to provide an electron bombarded semiconductor device having a doubly distributed deflection structure.

It is another object of the present invention to provide a doubly-distributed deflection structure in which the propagation of the input signal can be synchronized to both the electron beam velocity and the target signal propagation velocity, whose impedance matches the 50 ohm transmission lines without the need of impedance transformers or tuning elements, which has linear frequency response over bandwidths of dc to greater than 4 GHz with low harmonic and intermodulation distortions, and whose frequency response characteristics are not limited by the electron beam transit time across the length or width of the structure.

Another object of the present invention is to provide a distributed semiconductor target for use in connection with a doubly-distributed deflection structure which can operate over a broadband of frequencies to frequencies as high as 12 GHz, which operates at high efficiency as a Class-B amplifier and which has low harmonic and intermodulation distortion.

It is another object of the invention to provide a semiconductor target in which series-connected semiconductor diodes are disposed on a tapered stripline transmission line.

The above and other objects of the invention are achieved by an amplifier in which a sheet electron beam is projected onto a distributed semiconductor target in which the signal to be amplified is supported as a traveling electromagnetic wave and in which the sheet beam is deflected by an input signal applied by a doubly-distributed deflection structure whereby the beam sequentially strikes the target in synchronism with the traveling electromagnetic wave in the distributed target to provide incremental amplification of the wave.

BRIEF DESCRIPTION OF THE DRAWINGS

FIG. 3 is a sectional view taken along the line 3—3 of FIG. 2;

FIG. 4 is a sectional view taken along the line 4—4 of FIG. 2;

FIG. 5 is a sectional view taken along the line 5—5 of FIG. 2;

FIG. 6 is a sectional view taken along the line 6—6 of FIG. 2;

FIG. 7 is a sectional view taken along the line 7—7 of FIG. 5;

FIG. 14 is a schematic view showing the electron beam impinging upon the distributed semiconductor target at three different times;

FIG. 15 is a perspective view of series diode array including coupling capacitors;

FIGS. 16, 17, and 18 show another doubly distributed deflection structure;

FIG. 19 shows the target assembly of FIG. 18 in more detail;

FIG. 20 is a schematic view of a device similar to that of FIG. 1 including a multiple meander line doubly-distributed deflection structure.

FIG. 21 shows a tapered stripline target providing its output to an output coupler.

DESCRIPTION OF THE PREFERRED EMBODIMENT

Figure 1:
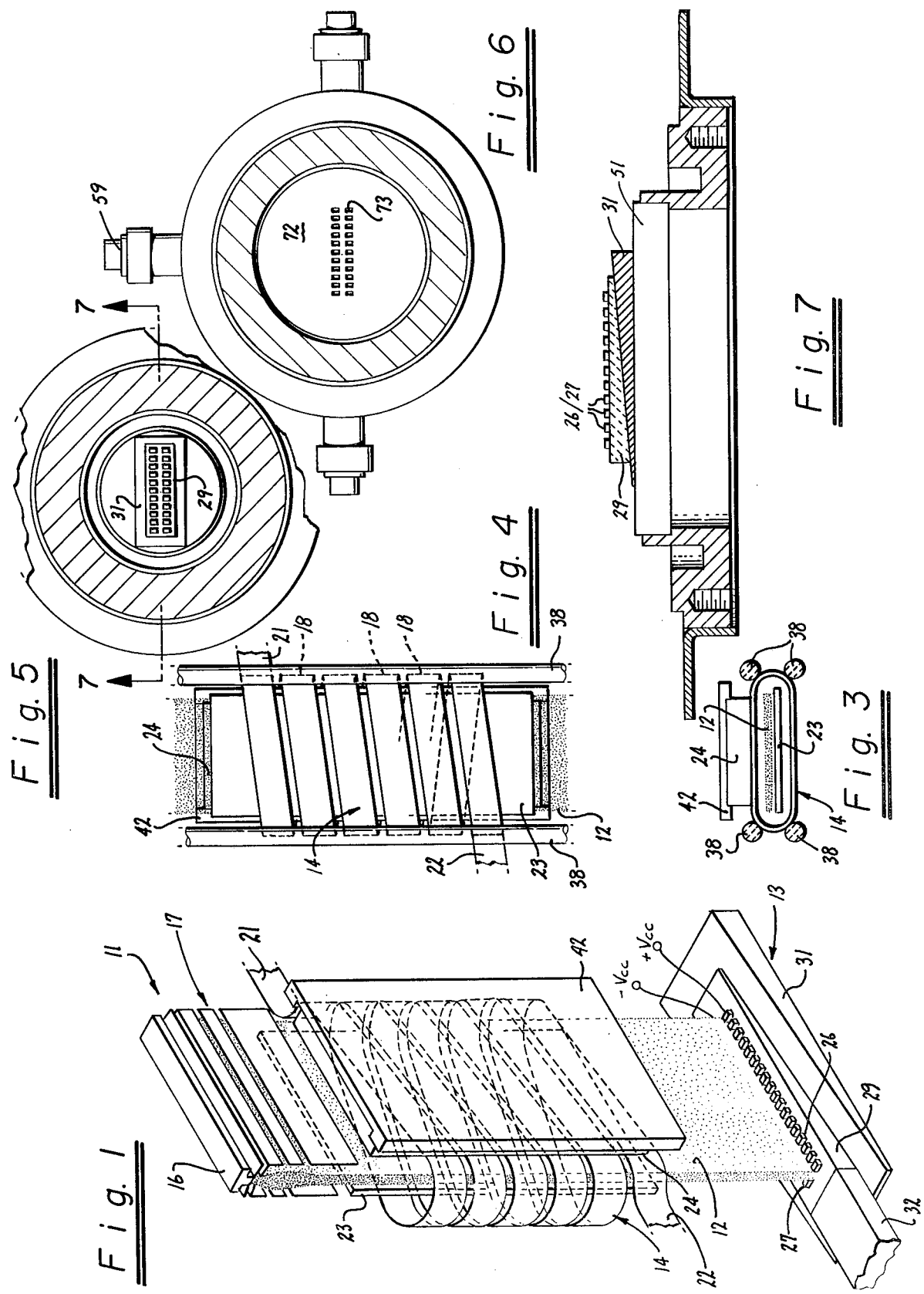
FIG. 1 is a schematic view of the preferred embodiment of the electron bombarded semiconductor amplifier incorporating the present invention.

Referring to a perspective diagram drawing of FIG. 1 the amplifier device includes an electron gun designated generally at 11 which projects a sheet electron beam 12 towards the target 13. A doubly-distributed deflection structure 14 is disposed between the gun and target and deflects the electron beam in accordance with an input signal. The electron gun schematically shown includes a cathode 16 and an electrostatic focusing arrangement 17 which serves to form and focus a laminar sheet electron beam for projection through the doubly distributed deflection structure. A suitable electron gun design is described in co-pending application Ser. No. 149,445, filed June 3, 1971.

The deflection structure shown includes a helically flat wound conductor 18 having an input 21 for connection to a source of input signal and an output 22 which may be connected to a suitable termination. Alternately the output line may be omitted and the termination provided internally. The helically wound structure is provided with a ground plane 23 adjacent to one side of the beam. The ground plane serves to shield the beam from the electric fields on the back side of the helical structure and to provide a planar surface adjacent to the beam which maximizes the transverse fields at the beam. The transverse electric fields between the upper winding and the ground plane serve to deflect the electrons in the beam as will presently be described. In order to slow down the transit time of the input signal along the portion of the windings adjacent to the beam so that it is synchronized with the signal propagating in the target there is provided a dielectric substrate 24, such as beryllium oxide adjacent to the windings. The outer surface 25 of the substrate is provided with a ground plane 42 whereby the electric fields between the helix and this ground plane travel through the substrate and the propagation is slowed due to the greater dielectric constant. Since the predominant portion of the fields between the helix and the ground planes is through the substrate this serves to have a major effect on decreasing the velocity. The smaller portion of the fields between the helix and ground plane 23 serve to deflect the electron beam.

One form of target to be presently described in detail comprises semiconductor devices 26 and 27 disposed on a tapered dielectric substrate 29 such as beryllium oxide, which in turn is mounted on a heatsink 31. The enlarged end of the tapered substrate is connected to an output stripline 32. The electromagnetic waves are amplified as they travel from the narrow end towards the enlarged end of the target structure. As will presently be explained the electromagnetic waves are incrementally amplified by the deflected electron beam to provide an amplified signal at the stripline 32.

Figure 2:
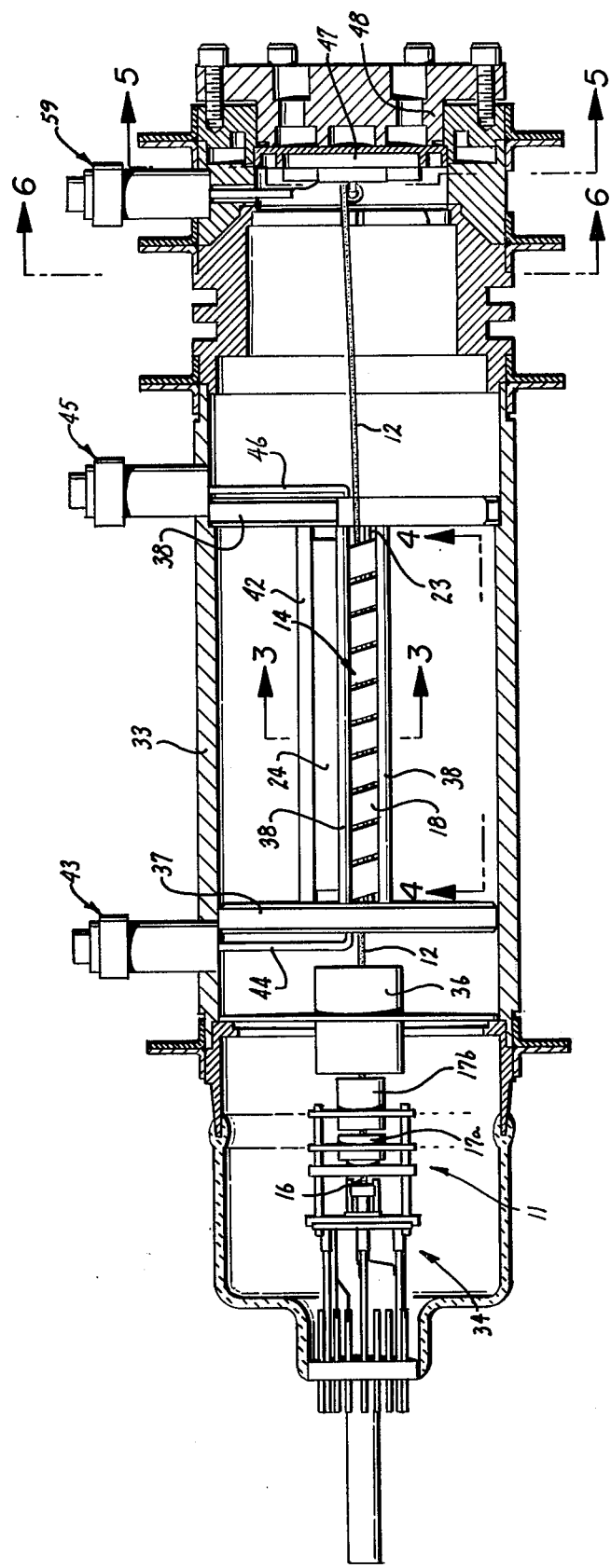
FIG. 2 is an elevation of view in section showing an electron beam semiconductor device in accordance with the invention.

A sectional view of an amplifier in accordance with the invention is shown in FIG. 2. The amplifier includes an evacuated envelope 33 in which the working elements of the amplifier are enclosed. The electron gun 11 is supported from the envelope by a suitable support structure 34 and includes an indirectly heated cathode 16 and electrostatic focusing means designated generally at 17a and 17b. An anode 36 provides additional focusing and beam accelerating voltage for the sheet electron beam 12.

The deflection structure is supported on a pair of spaced discs 37 and 38 which are accommodated within the envelope at 33. The discs support four spaced insulating rods 38, FIGS. 2 and 3, which, in turn, support the flattened helix 14. Ground plane 23 is supported by the end plates substantially in the middle of the helix as shown in FIG. 3. The helix winding supports dielectric substrate 24 which is sandwiched between the windings and the ground plane 42. Coaxial connector 43 provides connection via the lead 44 to the input and of the helix and output coaxial connector 45 provide a connection via lead 46 to the output, where the helix can be suitably terminated.

The semiconductor target assembly is supported on a heatsink 47 held by support 48. The target assembly is more clearly shown in FIGS. 5, 8, 9, 10, 11, and 12. The target assembly comprises a metal support 31 disposed on metal base, FIGS. 1 and 7, which supports tapered dielectric wafer 29. A plurality of diodes 26, 27 supported on the dielectric wafer form two arrays 3 and 54. The dielectric wafer, support 31 and the diodes 26, 27 and their terminals form a coupling structure to transfer radio frequency output signals to the output transmission line 32. DC voltages $+V_{cc}$ and $-V_{cc}$ are applied to the respective series connected diode strings at one end of the diode array via the input lead 56, 57. These leads are, in turn, connected to the coaxial connectors 59, one of which is shown. There are three such connectors, FIG. 6, to provide the two dc voltages and to conduct the output signal from line 32.

Figure 8:
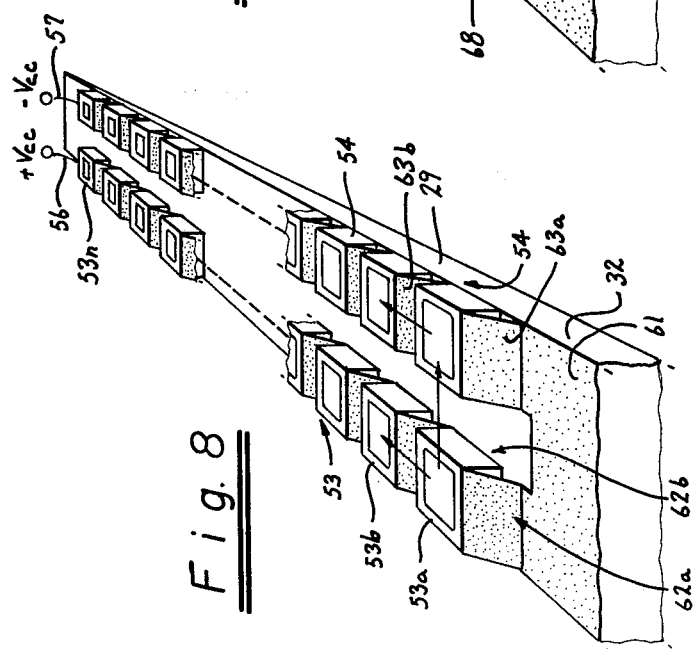
FIG. 8 is a view of a semiconductor target having a complementary series-connected diode array for Class-B operation.
Figure 12:
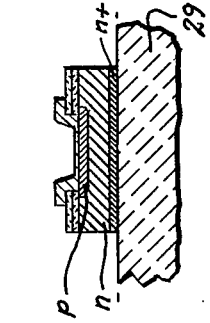
FIG. 12 is a cross-sectional view showing the diodes employed in the array of FIG. 11.
Figure 10:
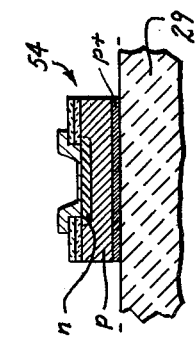
FIG. 10 is a cross-sectional view showing the other semiconductor diodes incorporated in the array of FIG. 8.
Figure 9:
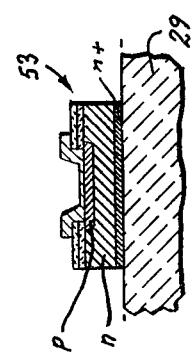
FIG. 9 is a cross-sectional view showing one of the semiconductor diodes incorporated in the array of FIG. 8.

Referring specifically to FIG. 8, the target assembly is illustrated as comprising a tapered beryllium oxide substrate 29 on which are mounted diode arrays 53 and 54. The diodes may be formed in the manner taught in co-pending application Ser. No. 204,810. The diode arrays are interconnected by means of conductive film 61 which, in turn, forms one conductor of the output stripline 32. The film includes a strip portion 62a which is connected to the upper surface of diode 53a. The other terminal of diode 53a overlies a conductive strip 62b which, in turn, is connected to the upper portion of the next diode, 53b, etc., until the last diode strip 62n connects to diode 53n. The lower terminal of the diode 53n is connected to the voltage source $+V_{cc}$. The other set of diodes are 54a, 54b, through 54n, and are likewise series-connected by strips 63a, 63b, through 63n, to voltage source $-V_{cc}$. The diodes 53 also shown in FIG. 9, are of the p-n type while the diodes 54, also shown in FIG. 10, are of the n-p type to provide a complementary series array.

Application of the reverse bias voltage to the diodes provides internal electric fields which cause holes or electrons or both to flow through the diodes and to an external load connected to the terminal 61. Electron-hole carrier pairs are formed by the incident electrons striking the target. The beam strikes the target with a voltage typically between 10 and 20 kV, or even greater. For each electron entering the target a current multiplication takes place which is approximately 2000:1 at 10 kV and 5000:1 at 20 kV. The target current is primarily electron current or hole current depending upon the extent of beam penetration and whether the diodes are p-n or n-p respectively. Design allowance must be made for the difference in drift velocities for the electrons and holes. The current flow in the targets is then proportional to the electron beam current striking the target. This basic property of the device leads to its linear amplification properties.

The target diodes can also be series-connected in a complementary connection which eliminates the need for using diodes of both p-n and n-p type. For best high frequency response and relatively shallow beam penetration p-n diodes are preferred; for resistance to electron radiation effect, n-p diodes are preferred. Diodes of one conductivity type are connected in such an array in FIGS. 11 and 12. Diode arrays 66 and 67 are series-connected by conductive strips 68 and 69 to voltage sources $+V_{cc}$ and $-V_{cc}$ respectively. The end of the array is connected to stripline or film 71.

The amount of power which must be dissipated from the array substrate is minimized by shield 72, FIG. 6, which contains a plurality of openings 73 with individual areas corresponding to the active portion of the underlying diodes whereby the portion of the sheet beam 12 is prevented from impinging upon the active area of the diodes by being intercepted and dissipated by the shield 72.

In the previous description reference was made to synchronizing deflection of the sheet electron beam with the propagating wave in the target structure. The electron beam propagation and the signal propagation in the target are orthogonal to each other. Therefore, the propagation velocity in each direction may be independently selected. Independent variations of the orthogonal propagation velocities can be controlled by a dielectric loading technique as well as varying the geometry of the metallic members of the doubly distributed deflection circuit.

To design the preferred deflection structure one first determines the beam velocity and the signal propagation velocity in the target structure. Electron beams are typically in the 10 to 30 kV range corresponding to propagation velocities of approximately 0.19 to 0.33 of speed of light. The target arrays are typically mounted on beryllium oxide or other insulating materials which have characteristic propagation velocities. Beryllium oxide, which has dielectric constant of 6, has a propagation velocity of the speed of light divided by the square root of 6. The beam and target propagation velocities are used to select the width of the tape and the overall width of the deflection structure.

The impedance of the structure is determined by the width of the tape and the spacing to the centrally located ground plane 23, as is the propagation velocity. Since the helix is operating in a predominantly TEM mode its impedance may be determined from stripline design curves. For tape width which is five times the spacing to the ground plane the impedance will be 50 ohms. For example, if the tape is 0.350 inches wide, a 70 mil spacing to the ground plane is appropriate. The tape width is also selected so that the beam transit time across each section of the tape does not limit the desired frequency response. The frequency response of the deflection structure is limited by transit time across each tape segment and excitation of TM modes at higher frequencies. For example, a 0.350 inch wide tape will provide frequency response up to about 4 GHz with a 15 kV beam.

Synchronism of the signal to the propagation in the target structure is provided by loading one side of the flattened helical structure 18 with the same dielectric used in the target array. For example, if the targets are mounted on a beryllium oxide stripline then the deflection structure is also loaded with beryllium oxide. The impedance of the deflection structure in the region where it is loaded with the dielectric will be the parallel combination of the impedance from the helix tape to the ground plane 23 and from the tape through the dielectric to the second opposite ground plane 42. The impedance and propagation velocity can be adjusted by properly selecting these two dimensions. This is once again done by reference to standard stripline design curves.

The total width of the deflection structure is now selected to provide the appropriate signal delay for the given pitch of the helical winding. This is simply done by taking the total circumferential distance around the structure and comparing it to the distance the signal has propagated in the direction of the electron beam. The distance in the direction of the electron beam is simply the tape width plus the spacing between tapes. For a beam propagating at approximately 15 KEV and for a target which is constructed using a beryllium oxide substrate, the deflection structure width is limited to less than approximately one-half inch.

The maximum width of the deflection structure may be increased by increasing the tape width, but this increases the transit time and reduces frequency response. However, there is one technique to overcome such limitation. A bifilar helix may be used instead with each element of the helix having a 100 ohm impedance, if a 50 ohm structure impedance is desired. At the input to the tube, the signals on the two helices can easily be synchronized to provide a constant delay from one helical winding to the next.

FIGS. 14a, 14b, and 14c show the sheet electron beam impinging on the target at three different sequential times. It is seen that the wave is traveling from left to right. The beam modulations velocity is selected to match the propagation velocity of the target array.

The basic configuration of the tapered stripline series-connected distributed target array is shown in FIGS. 1, and 8 through 12. As previously described, the target array consists of semiconductor diodes 53, 54, or 66, 67 which are series-connected and mounted on an insulating substrate 29 which has been designed for optimum heat dissipation. The heatsink 29 which is also the insulating substrate, is bonded to a conducting ground plane 31. This substrate is tapered so that the greatest distances to the ground plane occurs at the output end of the array. The taper causes an increase in impedance along the length of the diode array thereby achieving an impedance transformation. The width of the diode substrate metallization in the individual arrays is selected so that the stripline formed by the ground plane, the insulating dielectric and the diode bottom contacts provides approximately two times the desired impedance at the output terminal. In operation, the diodes in the individual arrays are sequentially excited by an electron beam which produces diode output in phase with the RF signal propagating in the tapered insulating substrate. Thus, each diode contributes to the RF signal and the total output at the load of the target array is the sum of the individual diode outputs. Each diode along the array operates into an impedance $Z_o/n$ where $Z_o$ is the output impedance and n is the number of diodes in each array.

The design concept is to select the desired frequency response and output power. The individual diode thickness and area can then be determined to provide the proper transit time and capacitance, where the individual diode capacitance is divided by the number of diodes to determine the total array capacitance. The array size can be determined from the heat dissipation density capability of the substrate and the total power required. The substrate taper can then be selected to provide the desired output impedance. No other circuit elements, such as waveguides or impedance transformers are necessary.

Figure 13:
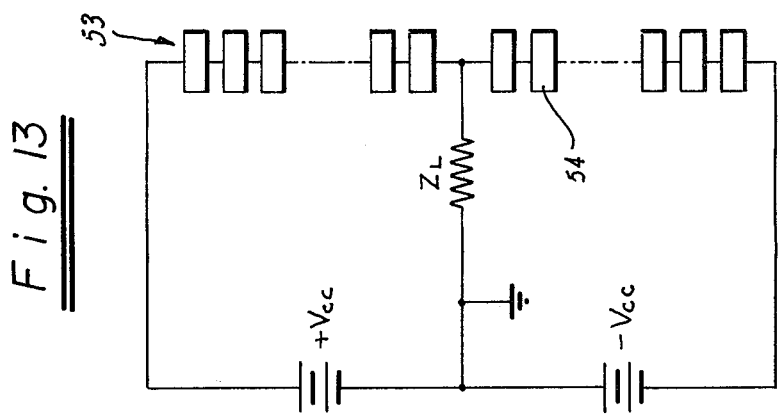
FIG. 13 is a circuit diagram showing the connection of the series array of semiconductor devices.
Figure 11:
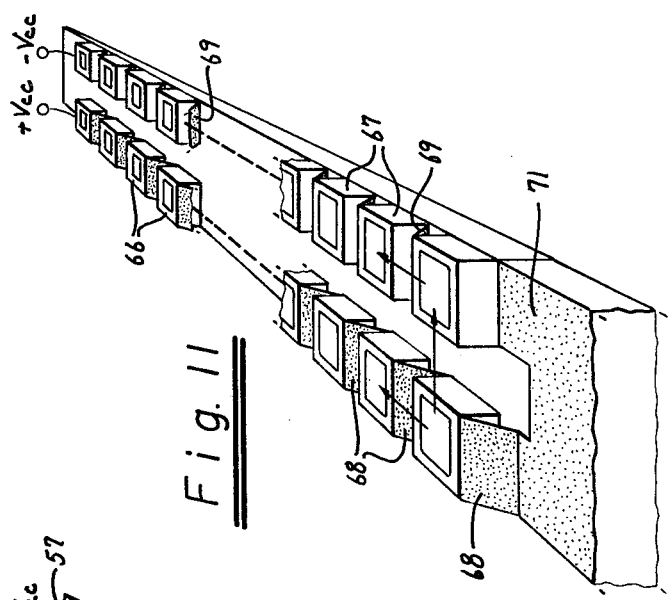
FIG. 11 is a view of a semiconductor target having a series-connected diode array using one type of diodes.

FIG. 13 is a schematic diagram showing the connection of series diodes 53, 54, or 66, 67, to a load $Z_L$ with applied bias voltages of $+V_{cc}$ and $-V_{cc}$. It is noted that the output voltage is increased over that of a single diode target while the current remains substantially equal to that of a single target. Consequently the power output is increased.

In series target array electron beam semiconductor devices applications, the target output voltage and power capability is increased by connecting targets in series, with no resulting loss in frequency response. As the electron beam voltage is much greater than the potentials on the target contacts, the targets in the series array can all be excited by the same beam, and the series scheme results in little increase in device complexity. The peak target output voltage capability is increased n times over that of a single target, where n is the number of targets in the array, and the use of a series array thus makes it relatively convenient to obtain output voltages beyond the capabilities of a single target.

The series connection of targets yields an impedance transformation that has no inherent response limitation or power loss. The impedance transformation arises from the fact that the output voltage swing $\Delta V$ appearing across the load impedance $Z_L$, FIG. 13, will be divided, assuming symmetry, equally across the targets 53, 54 in the array. The output current swing $\Delta I$ will appear, without change, in all the targets. Thus, each target in the array is presented with an impedance of $$Z_L' = (\Delta V/n)/\Delta I = 1/n Z_L \quad (1)$$

This impedance transformation has several consequences that will be considered below. The ultimate bandwidth of a lumped target facing a given load resistance $Z_L'$ is $$f_{b\,max} \cong 5.68 \sqrt{\frac{v_o}{v_{on}} \frac{\epsilon_n}{\epsilon} \frac{A_n}{A} \frac{Z_{Ln}}{Z_L'}} \text{ GHz} \quad (2)$$

where $\epsilon$ is the semiconductor dielectric constant, $v_o$ is the assumed constant carrier drift velocity, A is the target face area, and $Z_L$ is the effective value of target load resistance. The n subscript denotes particular values of the variables that are used as normalizing constants. These have the values $\epsilon_n = 11.5\, \epsilon_o$, $v_{on} = 10^7$ cm/sec, $A_n = 1$ mm$^2 = 10^{-2}$ cm$^2$, $Z_{Ln} = 1$ ohm. As is clear from (2), the ultimate bandwidth of a given target in the array, and thus the bandwidth of the array, will be greater than the bandwidth of a single target driving the actual load $Z_L$. From (1) and (2) the bandwidth is seen to increase as $\sqrt{n}$ in the transition from a single target to a string of n targets in series (each target identical to the single target). As achieving the bandwidth (2) requires the use of a drift region width given by $$w_{opt\,b} \cong 5.31 \sqrt{\frac{v_o}{v_{on}} \frac{\epsilon}{\epsilon_n} \frac{A}{A_n} \frac{Z_L}{Z_{Ln}}} \text{ microns,} \quad (3)$$

the drift region width of each target should be decreased as $1/\sqrt{n}$ to maintain optimum bandwidth.

The output voltage capability of each target is approximately proportional to its drift region width as $$V_l \cong \tfrac{1}{2} E_m w \quad (4)$$

$E_m$ is the peak value of electric field in the target drift regions which may be considered essentially constant as its dependence on w is small. Because of the variation of w with $Z_L$ obtained from (3), the output voltage capability calculated from (4) increases approximately as $\sqrt{n}$ for the series string we are discussing. As we have implicitly kept the individual target area constant in the transition from one target to the series array, the output current capability is affected only by the limiting current density, which is determined by the drift region width approximately as $$j_l \cong \epsilon v_o(E_m/w). \quad (5)$$

Consequently, the output current capability increases approximately as $\sqrt{n}$ for the series string presently under discussion. Thus, as the output current and voltage capabilities both increase approximately as $\sqrt{n}$, it is possible to obtain approximately $\sqrt{n}$ times the voltage, and n times the power into a given load impedance (load $Z_L$) through the single target to series target transformation described. In addition, the target bandwidth is increased, as is the total target area available for the dissipation of power.

The above demonstrates the potential for improvement of power-bandwidth capability through the use of series-connected target arrays. A convenient single-series transformation for design purposes is to simply scale the area of an individual target with the number of targets in the series array, so that $$A(n) = n A_1 \quad (6)$$

From (2) and (3) it is readily seen that the bandwidth $f_{b\,max}$ and optimum drift region width $w_{opt\,b}$ are invariant under this particular transformation because the impedance seen by each target will now be $(1/n)Z_L$. The design of a series target array for given power and bandwidth requirements then may be carried out as follows: first one establishes a prototype device, which is a single-target amplifier capable of driving the given load impedance with the required bandwidth; then, the single series transformation is applied with $A(n) = nA_1$. Although the bandwidth remains invariant, the peak output voltage is n times greater because the output voltage of each target remains the same (same drift region width). The peak output current is also n times greater because the area of each target increases as n, and the target current density remains the same (same drift region width). Therefore, the peak output power of the series array is $n^2$ times greater.

It is thus clear that the use of series targets overcomes the basic power-bandwidth limitation that is characteristic of single lumped targets. In principle, one may obtain any desired power level, either pulsed or CW, into a given load with this approach.

The higher beam current requirement for a given peak output current produces no efficiency loss at the ultimate pulsed output level, compared with an identical single target driven to ultimate output (at a lower power level). Under these conditions, RF target efficiencies of 60 to 70 percent can be attained. However, an efficiency loss is unavoidable when operating under CW conditions where the target voltages and currents always remain considerably below their ultimate values. This occurs because the ratio $V_{STMIN}/V_{STMAX}$ is smaller, where these are the minimum and maximum voltages across each target, $V_{STMIN}$ being limited by the onset of target saturation. In addition, the efficiency is further reduced with a series target array because a greater number of targets will be employed for the same peak output current and because the total target area increases as $n^2 A_1$ to obtain the area required for CW operation at a given power level.

The sine-wave efficiency of the series Class B array can be shown to be $$\eta_{ST} = (\pi/4)(1-v)/(1+v), \; v = V_{STMIN}/V_{STMAX} \quad (7)$$

This is the dc to RF conversion efficiency of the target section alone, and does not include the power dissipated by the electron beam. The quantity v may be interpreted as the ratio of total or individual minimum and maximum target voltages. From the definition of $\eta_{ST}$, it is clear that the power $P_c$ dissipated by carrier currents in the semiconductor target and the RF output power $P_{out}$ are related to $\eta_{ST}$ as $$\eta_{ST} = P_{out}/(P_{out} + P_c) \tag{8}$$

The overall efficiency of a beam-semiconductor amplifier using a series target array will also be reduced because of the power dissipated by the electron beam. The beam power is simply $$P_B = V_B I_B \tag{9}$$

The choice of beam voltage $V_B$ is somewhat arbitrary, as it depends on the electron gun characteristics, the deflection sensitivity required, etc. Once $V_B$ is chosen, however, the target current gain N is fixed. The static beam current required for a deflected beam amplifier will then be $$I_B = f(\tfrac{1}{2} V_{pp}/Z_L)(n/N), \tag{10}$$

where n is the number of targets in series, $V_{pp}$ is the peak-to-peak RF output voltage appearing across the load, $Z_L$ is the load impedance, and $f > 1$ is the beam coverage factor which accounts for the beam current that must be wasted to cover a series array in which a finite amount of area is required for the series interconnects. Since the target current gain N can be expressed as $$N = (V_B - V_c)/V_{pair} \tag{11}$$

where $V_c$ is the effective beam voltage loss in penetrating the target contact and $V_{pair}$ is the voltage equivalent of the energy required for electron-hole pair creation in the semiconductor target, the beam power (9) may be written as $$P_B = \tfrac{1}{2} nf \frac{1}{1 - \frac{V_c}{V_B}} \frac{V_{pp} V_{pair}}{Z_L} \tag{12}$$

since the overall amplifier efficiency, including the beam power, is $$\eta_{oa} = P_{out}/(P_{out} + P_c + P_B) \tag{13}$$

From (7), (8), and (12) we obtain the following expression for $\eta_{oa}$ $$\eta_{oa} = \frac{1}{\frac{4}{\pi} \frac{1+\nu}{1-\nu} + 4 nf \frac{V_{pair}}{V_{pp}} \frac{1}{1 - \frac{V_c}{V_B}}} \tag{14}$$

Since $$(1+\nu)/(1-\nu) = (V_{STMAX} + V_{STMIN})/(V_{STMAX} - V_{STMIN}) = (V_{pp} - 2V_{STMIN})/V_{pp}, \tag{15}$$

(14) may be written as $$\eta_{oa} = \frac{\frac{\pi}{4}}{1 + n\left(2 \frac{V_{STMIN}}{V_{pp}} + \pi f \frac{V_{pair}}{V_{pp}} \frac{1}{1 - \frac{V_c}{V_B}}\right)} \tag{16}$$

where $V_{STMIN}$ is now regarded as the minimum linear target voltage for an individual target of the series array, and $V_{pp}$ is still the peak-to-peak load voltage produced by the entire series array.

As well as entering into the calculation of efficiency, the electron beam power also increases the power per unit target area that must be dissipated by the target cooling structure. In a Class B amplifier, the average beam power that a target will receive in sinusoidal operation will be $$P_B' = (1/\pi) P_B \tag{17}$$

Therefore, the target power dissipation density, including the electron beam power, will be $$PD_{st} = (P_c + 2/\pi P_B)/A_T \tag{18}$$

where $A_T$ is the total target area, the sum of areas of all the individual targets in the Class B array. From (7), (8), (15), and (12), (18) takes the form $$PD_{st} = \frac{\left[\frac{4}{\pi} \frac{V_{pp} + 2V_{STMIN}}{V_{pp}} - 1\right] P_{out} + \frac{n}{\pi} \frac{1}{\left(1 - \frac{V_c}{V_B}\right)} \frac{V_{pp} V_{pair}}{Z_L}}{A_T} \tag{19}$$

Note that the factor f does not appear in (19) because the extra beam current required by the area utilization factor does not fall on the active area of the target.

Recognizing that $P_{out} = \tfrac{1}{8} V_{pp}^2/Z_L$, (19) becomes $$PD_{st} = \frac{P_{out}}{A_T} \left[ \frac{4}{\pi} \left(1 + 2n \frac{V_{STMIN}}{V_{pp}}\right) - 1 + \frac{8}{\pi} n \frac{1}{1 - \frac{V_c}{V_B}} \frac{V_{pair}}{V_{pp}} \right], \tag{20}$$

where we now regard $V_{STMIN}$ as the minimum voltage for an individual target, and $V_{pp}$ as the peak-to-peak output voltage at the load. Another useful way of writing (20) is $$PD_{st} = \frac{\left(\frac{4}{\pi} - 1\right) \frac{1}{8} V_{pp}^2 + \frac{n}{\pi} V_{STMIN} V_{pp} + \frac{n}{\pi} \frac{1}{1 - \frac{V_c}{V_B}} V_{pp} V_{pair}}{n^2 (A_1 Z_L)} \quad (21)$$

where $A_1$ is the area of the target. The quantity $A_1 Z_L$ is determined by the bandwidth requirement for the target.

The significant fact that (21) shows in relation to series-connected target design for CW operation is that, given a required output power $P_{out}$ and fixed load impedance $Z_L$, a bandwidth specification that must be met, and fixed values of $V_{STMIN}$, $V_{pair}$, $V_c$, and $V_B$ ($V_{pp}$ is fixed by specification of $P_{out}$ and $Z_L$), the overall target power density may be reduced to as low a value as desired simply by increasing the number of targets, n, to the required value. However, as shown by (16), the overall amplifier efficiency decreases with increasing n, the other parameters remaining constant as above. Thus, the requirement for a certain power dissipation density dictates a corresponding overall amplifier efficiency. Under CW conditions the series-connected array provides important advantages in output impedance and reliability.

Each diode passes current only during half the RF cycle. Optimum frequency response and efficient Class-B operation are possible only if the full sinusoidal voltage is obtained across each diode. The use of coupling capacitors between the arrays can achieve this. FIG. 15 shows a schematic of the diode array with coupling capacitors. Fourier analysis of the voltage waveforms shows that the fundamental frequency component of the output waveform is equal and in phase on both diode arrays. The coupling capacitors do not affect this wave since both ends of the capacitor see the same fundamental waveform, and no current flows in the capacitor. For the harmonics, however, the two lines are 180 degrees out of phase, and all this voltage appears across the capacitors. Current is shunted through the capacitor, and the harmonic waves are suppressed.

It is important to note that coupling capacitors are not necessarily needed at every diode pair. The harmonic waves can be suppressed if the coupling capacitors are spaced along the array at distances small compared to a wavelength of the harmonic components. The number of coupling capacitors and their location will determine the amplifier efficiency as a function of frequency and the peak power capability.

Although the preferred doubly-distributed deflection structure and the preferred target series connect target structure were described above other structures can be used. Referring to FIGS. 16, 17, and 18 another doubly-distributed deflection structure and target structure is shown. The deflection structure utilizes dielectrically loaded striplines which propagate in a direction perpendicular to the electron flow. More particularly the structure includes a plurality of striplines 81 which are fed from an input feeder line 82 and each terminated by resistors 83. The striplines are supported on a dielectric 84 disposed in the grooves 86 formed in the ground plane 87. A second ground plane 88 is disposed adjacent the stripline 81. Electron beam 12 is projected by gun 11 past the striplines. The beam 12 strikes semiconductor targets 91 and 92, FIGS. 18 and 19. The targets 91 and 92 are elongated or extended diodes disposed in ridged waveguide 93 whereby the input signal propagates along the diodes and waveguide from the termination end 94, FIG. 17 to the output end 96. Synchronism between the input signal applied to the deflection structure and the output signal propagating in the waveguide is obtained by suitably designing the delay lines formed by striplines 81 dielectric 84 and ground plane 87. Synchronism between the input signal and the electron beam velocity is maintained by appropriately spacing the delay lines and design of the feeder 82. This deflection structure can also be used with the tapered target configuration shown in FIGS. 8, 9, 10, 11, 12. The ridged waveguide target can be used with the doubly distributed deflection structure described in FIGS. 1, 3, and 4.

FIG. 20 shows an electron bombarded semiconductor amplifier including another design of doubly distributed deflection structure with RF traveling-wave structures which propagate in a direction parallel to the electron flow. The reference numbers applied to the parts of the amplifier correspond to those previously used for like parts. The deflection structure includes a plurality of paralleled and spatially staggered meander lines 97 fed from a tapered input stripline 98 at one end and terminated by terminations 99 at the other end. The tapered input stripline is designed to have a signal propagation velocity essentially equal to the propagation velocity of the output signal and the meander lines have a propagation velocity substantially equal to that of the electron beam. The beam deflection is schematically illustrated.

Another form of target which can be used is schematically shown in FIG. 21. The target includes a pair of spaced extended or elongated tapered diodes 101 and 102 which form one conductor of a tapered stripline whose output is combined in an output coupler 103. The output coupler 98 would typically incorporate an impedance transforming element.

There has been provided an electron bombarded semiconductor amplifier in which a doubly-distributed deflection structure synchronizes the input signal with the electron beam velocity and with output signal propagation velocity in a target composed of an extended semiconductor diode or series-connected diodes whereby to achieve high power broadband signal amplification. The doubly-distributed deflection structure can be of various designs. The important feature of the structure is that the action of the input signal on the electron beam is synchronized both with the beam velocity and with the wave in the distributed target structure. The semiconductor target can also take various forms such as an elongated narrow diode structure, a tapered diode structure, or a plurality of series-connected diodes. The targets may be composed of complementary p-n and n-p diodes or they may be connected complementary. The target may be designed to provide various impedance levels and power outputs.

Thus, it is seen that there has been provided an improved wideband high frequency high power electron bombarded semiconductor amplifier.

We claim:

1. An electron bombarded device comprising an evacuated envelope, an electron gun positioned in said envelope, said gun serving to form and project a sheet electron beam with a predetermined velocity, a target spaced from said electron gun to receive said beam, doubly-distributed beam deflection means adapted to receive an input signal disposed between said electron gun and said target in cooperative relationship with said beam to deflect the beam in accordance with said input signal, said deflection means serving to propagate the input signal across said sheet beam at a predetermined velocity and along said sheet beam at said predetermined velocity to interact with and deflect the electrons in the beam in accordance with the input signal.

2. An electron bombarded device as in claim 1 wherein said beam deflection means comprises a ground plane disposed adjacent one face of said beam and conductor means adjacent the other face of said beam for receiving the input signal whereby to provide transverse electric fields between said conductor means and said ground plane to deflect the electrons in the electron beam in accordance with said signal.

3. An electron bombarded device as in claim 2 in which said conductor means comprises a plurality of spaced adjacent delay means with input means for receiving said input signal and delaying application to the adjacent ends of sequential delay means.

4. An electron bombarded device as in claim 3 wherein said delay means are disposed parallel to the direction of the electron beam.

5. The electron bombarded device as in claim 3 wherein said delay means are perpendicular to the direction of the electron beam.

6. An electron bombarded device as in claim 4 wherein said delay means comprise meander lines spaced adjacent to one another.

7. An electron bombarded device as in claim 5 wherein said delay means are striplines.

8. An electron bombarded device as in claim 7 wherein said meander lines are disposed adjacent to a ground plane.

9. An electron bombarded device as in claim 7 wherein said striplines are disposed adjacent a ground plane and supported thereon by dielectric means.

10. An electron bombarded device as in claim 2 wherein said conductor means comprises first portions of a helically wound conductor adjacent said beam and second portions opposite said ground plane.

11. An electron bombarded device as in claim 10 including a member of dielectric material having a face adjacent said first portions and a second ground plane on the other face of said dielectric material.

12. An electron bombarded device comprising an evacuated envelope, an electron gun positioned in said envelope, said gun serving to form and project a sheet electron beam, a target spaced from said electron gun to receive said beam, said target comprising a distributed semiconductor target adapted to receive said electron beam and generate an output signal, doubly-distributed beam deflection means adapted to receive an input signal disposed between said electron gun and said target in cooperative relationship with said beam, said doubly distributed beam deflection means serving to propogate the input signal across the sheet beam a first predetermined velocity and along the beam at substantially the velocity of the beam, to deflect the beam in accordance with an input signal and output coupling means for transmitting the output signal from said target.

13. An electron bombarded device as in claim 12 wherein said semiconductor target comprises a plurality of series-connected diodes.

14. An electron bombarded device as in claim 12 wherein said target comprises at least one elongated diode having a length substantially equal to the width of the sheet electron beam.

15. An electron bombarded device as in claim 14 wherein said diode is tapered in width.

16. An electron bombarded device as in claim 13 wherein said diodes are mounted on a tapered dielectric support supported on a ground plane, said diodes, dielectric support and ground plane forming a transmission line for transmitting the output signal 17. An electron bombarded device comprising an evacuated envelope, an electron gun positioned in said envelope, said gun serving to form and project a sheet electron beam with predetermined velocity, a distributed semiconductor target spaced from said electron gun to receive said beam and generate an output signal which propagates along said target, doubly distributed beam deflection means adapted to receive an input signal disposed between said electron gun and said target in cooperative relationship with said beam to deflect the beam in accordance with said input signal, said deflection means serving to propagate the input signal across said sheet beam at a velocity corresponding to the velocity of propagation of signals in the target and along such sheet beam at said predetermined beam velocity.

18. An electron bombarded device as in claim 17 wherein said beam deflection means comprises a ground plane disposed adjacent one face of said beam and conductor means adjacent the other face of said beam for receiving the input signal whereby to provide transverse electric fields between said conductor means and said ground plane to deflect the electrons in the electron beam in accordance with said signal.

19. An electron bombarded device as in claim 18 in which said conductor means comprises a plurality of spaced adjacent meander lines disposed parallel with the electron beam with input means for receiving said input signal and delaying application to the input end of sequential adjacent meander lines.

20. An electron bombarded device as in claim 17 wherein said conductor means comprises a plurality of spaced stripline delay means disposed transversely of the direction of flow of the electron beam with means for receiving the input signal and delaying application to adjacent ends of sequential delay means.

21. An electron bombarded device as in claim 18 wherein said conductor means comprises first portions of a helically wound conductor adjacent said beam and second portions opposite said ground plane.

22. An electron bombarded device as in claim 21 including a member of dielectric material having a face adjacent said first portions and a second ground plane on the other face of said dielectric material, external to said helical conductor.

23. An electron bombarded device as in claim 17 wherein said semiconductor target comprises a plurality of series-connected diodes.

24. An electron bombarded device as in claim 17 wherein said target comprises at least one elongated diode having a length substantially equal to the width of the sheet electron beam.

25. An electron bombarded device as in claim 24 wherein said diode is tapered.

26. An electron bombarded device as in claim 23 wherein said diodes are mounted on a tapered dielectric support supported on a ground plane, said diodes, dielectric support and ground plane forming a transmission line for transmitting the output signal.

* * * * *